United States Patent [19]
Brown et al.

[11] Patent Number: 4,981,840
[45] Date of Patent: Jan. 1, 1991

[54] PROCESS FOR PREPARING METAL-CERAMIC COATINGS ELECTRICALLY SUPERCONDUCTING ABOVE 77 DEGREES KAPPA

[75] Inventors: Charles A. Brown; Edward M. Engler; Victor Y. Lee, all of San Jose, Calif.

[73] Assignee: International Business Machines Corporation, Armonk, N.Y.

[21] Appl. No.: 387,246

[22] Filed: Jul. 28, 1989

Related U.S. Application Data

[60] Continuation-in-part of Ser. No. 237,656, Aug. 29, 1988, abandoned, which is a division of Ser. No. 85,055, Aug. 13, 1987, abandoned.

[51] Int. Cl.$^5$ .................. H01L 39/12; B05D 5/12
[52] U.S. Cl. .................. 505/1; 505/739; 505/741; 505/785; 427/62; 427/63; 427/126.3
[58] Field of Search ............ 505/1, 701, 725, 739, 505/785; 427/62, 63, 96, 126.3; 428/545

[56] References Cited

U.S. PATENT DOCUMENTS

| | | | |
|---|---|---|---|
| 4,001,146 | 1/1977 | Horowitz | 252/514 |
| 4,152,386 | 5/1979 | Winter | 264/108 |
| 4,183,746 | 1/1980 | Pearce et al. | 75/234 |

FOREIGN PATENT DOCUMENTS

| | | |
|---|---|---|
| 56-085814 | 7/1981 | Japan . |
| 2072707 | 10/1981 | United Kingdom . |

OTHER PUBLICATIONS

*IBM Technical Discl. Bull.*, vol. 8, No. 10, Mar. 1986, p. 1462.
Engler et al, *J. Am. Chem. Soc.*, vol. 109, No. 9, 1987, p. 2848.

*Primary Examiner*—Shrive Beck
*Assistant Examiner*—Margaret Bueker
*Attorney, Agent, or Firm*—Joseph G. Walsh

[57] ABSTRACT

Substrates are coated with durable, adherent and continuous superconductive coatings by applying thereto a suspension of finely divided metal, finely divided ceramic superconducting above 77° K., and fluorinated polymer in an organic solvent. The resulting coatings are adherent, durable and superconducting above 77° K.

8 Claims, No Drawings

PROCESS FOR PREPARING METAL-CERAMIC COATINGS ELECTRICALLY SUPERCONDUCTING ABOVE 77 DEGREES KAPPA

DESCRIPTION

The present application is a continuation-in-part of copending application Ser. No. 07/237,656, filed Aug. 29, 1988, now abandoned, which is a divisional application of Ser. No. 07/085,055 filed Aug. 13, 1987 and now abandoned.

TECHNICAL FIELD

The present invention is concerned with a process for preparing substrates coated with composites of metals and superconducting ceramics. The coatings are durable, adherent and continuous as well as superconducting above 77° K.

BACKGROUND ART

The technical breakthrough of Bednorz and Muller (Z. Phys. B, 64, 189 (1986)) was the first major improvement in superconducting transition temperature ($T_c$) in the last decade. This material was a compound of nominal composition $La_{2-x}M_xCuO_y$ where M=Ca, Sr, or Ba, typically between 0 and 0.3 and y varies with preparation conditions. Subsequently it was reported by Chu et al. (Phys. Rev. Letters, 58, 405 (1987)) that the material of the composition $Y_{1.2}Ba_{0.8}CuO_y$ showed the onset of superconductivity in the mid-n degree Kelvin range. Engler et al. (Jn. Am. Chem. Soc., Vol. 109, No. 9, 1987, p. 2848) reported superconducting materials having the composition $Y_iBa_2Cu_3O_y$ where y is sufficient to satisfy the valence requirements of the metals. Engler et al. showed that a variety of superconducting materials could be prepared with the general composition $AM_2Cu_3O_y$, where A was yttrium and/or one or more elements of the lanthanum group (that is, La, Nd, Sm, Eu, Gd, Dy, Ho, Er, Tm, Yb, Lu) and M was one or more elements of the group Ca, Sr, and Ba. Furthermore, the superconducting properties of these materials are very sensitive to their processing conditions.

Preparation of superconducting composites useful above liquid nitrogen temperature (77° K.) from superconducting ceramics and metals appears unknown prior to the present invention. There is prior art showing, for example, the application of conductor patterns on substrates using metal powder and various metal oxides. See, for example, U.S. Pat. No. 4,001,146. U.S. Pat. No. 4,183,746 shows mixtures of ceramic materials and metals; these compositions are useful in glass making. IBM TECHNICAL DISCLOSURE BULLETIN, Vol. 8, No. 10, March 1986, page 1462, shows an electro paste having increased adhesion. The electro paste includes metal particles, oxides and an organic vehicle. United Kingdom patent application GB No. 2,072,707 shows an electro conductive paste for metallizing, conductive paste for metallizing, containing metal, metal oxides, a binding agent and a solvent. The mentioned references are merely typical of a very large amount of such prior art dealing with metals and ceramics or metal oxides. None of this art, however, deals with superconductors in any way.

Kamioka et al, Japanese Kokai Patent Publication No. 56-85814, July 1981, teaches a process for making an electrode for a condenser. In the process lead barium bismuthate powder is used. The Japanese Patent Publication describes the lead barium bismuthate as "an excellent electrical conductor," and not as a superconductor. U.S. Pat. No. 3,932,315 of Sleight shows a similar composition which is a superconductor at 12.5° K. The Kamioka Patent does not sufficiently describe his process conditions to say that his product was superconducting, but in any event, even assuming arguendo that his product was ever superconducting and that his subsequent processing did not completely destroy the superconductivity, his final product would be totally devoid of superconductivity above 77° K.

DISCLOSURE OF THE INVENTION

It has now been found that finely divided ceramic particles superconducting above 77° K., when mixed with specific formulations of a metal in the finely divided state, with a fluorinated organic polymer, and with an organic solvent, form a coating mixture which can be used to coat substrates with durable, adherent and continuous coatings which are also electrically superconductive above 77° K. The superconducting behavior is shown by four probe resistive measurements and also the Meissner effect. The onset of superconductivity and the transition range can be comparable to those of the underlining ceramic superconducting material and superconductivity can be observed in both bulk and thin film sanples at a temperature comparable to that observed for the ceramic powder itself.

The preparation of composites of a metal which is a good electrical conductor and of a superconductor is important for current carrying applications; in the event of a momentary lapse in superconductivity due to transient high magnetic field or other reasons, the matrix of the conductive metal provides a path for the currents present, and prevents the excessive resistive heating which would occur in the superconductor above $T_c$. Superconductors of niobium alloys commonly use a copper shell to provide such a momentary current shunt. Superconducting ceramics are hard brittle materials and thus difficult to process and handle, especially in thin sections. A composite, like that of the present invention, which retains the superconductive properties with improvements in the mechanical properties facilitates fabrication. Obtaining superconductivity above 77° K. in the composites is dependent upon the formulation and composition of the coatings. The process and compositions described here are required to achieve the above advantages (current shunt and processability of coatings) while preserving superconductivity above 77° K.

In the process of the present invention, finely ground ceramic superconducting above 77° K. and metal particles are mixed in an organic solvent with a fluorinated organic polymer. The metal is typically present in from about 10 to 40% by weight of the superconducting ceramic. The most preferred amount is about 20%. Both the ceramic and the metal are present as finely divided particles, preferably less than 10 microns in diameter, and most preferably less than one micron. The mixture can be made either by simple mixing of powders individually or grinding the two particles together. The ceramic superconducting above 77° K. can be any of such known ceramic superconducting materials, some of which have been referenced above.

A fluorinated organic polymer is used as a binder. The polymer should be soluble in the organic solvent which is used as the suspension medium. The most preferred polymers are fluoroalcohol-acrylic acid esters. An example of such a material is poly(perfluoroalkyl acrylate). Such a material is commercially available under the trademark VITON. In general, the preferred amount of organic polymer is from about 10% to about 30% of the weight of the ceramic. When a binder which is not fluorinated is used, high temperature superconductivity is destroyed.

When so desired, a minor amount of a surfactant may be added to act as an aid to dispersion. The surfactant should be one that upon ignition leaves no ash. The surfactant available under the trademark TRITON has given good results. The use of a surfactant, however, is not an essential feature of the invention.

Silver, gold and tin are the preferred metals, most preferably silver. The substrate upon which the coating is applied should not react chemically with the coating in a way that destroys the superconductivity. The most preferred substrates are alumina, sapphire, barium titanate and magnesium oxide.

Any of a wide variety of organic solvents can be used. For example, acetone, butyl acetate, toluene and most preferably, methyl ethyl ketone. Mixtures of solvents can also be used.

In carrying out the process of the present invention, the finely divided superconducting ceramic, the finely divided metal and the fluorinated polymer are mixed with the organic solvent and applied to the substrate. The application can be by dipping the substrate in the mixture or by applying the mixture to the substrate by such conventional processes as spraying or spin coating. The mixture can simply be painted on the substrate. The solvent is removed by drying at a temperature of 20° 100° C., and the material is then heated to about 400° C., and held there from one to twelve hours to burn off the organic polymer. In some instances to improve the $T_c$, it is desired to anneal the resulting coating at 900° C. in the presence of oxygen, followed by cooling at the rate of 100 C. degrees per hour to 300° C., while maintaining the oxygen atmosphere.

Prior to the annealing under oxygen, the mixture can be applied as a paint or ink to surfaces in layers or patterns before drying. Annealing the dried layer produces a durable, adherent and continuous superconductive coating. In thin film coatings, the film is much more adherent and mechanically resistant to abrasion than a coating of pure ceramic powder prepared by a similar means without the metal.

There are a wide variety of uses for superconductivity at liquid helium temperatures which are rendered cheaper and more convenient at liquid nitrogen temperatures. One of the major drawbacks of the ceramic superconducting materials is the difficulty of processing to give coatings which are not highly friable and do not require high vacuum techniques to produce. Another problem has been fabrication of superconductor materials which have a current shunt to allow a path for the superconducting currents in the event of a momentary loss of superconductivity, e.g., in the presence of a high magnetic field transient. Both of these difficulties are solved by the current invention. The retention of the Meissner effect in these composites, which form hard adherent coatings, allows their use for magnetic shielding applications.

The following Examples are given solely for the purposes of illustration and are not to be considered as limitations on the present invention, many variations of which will occur to those skilled in the art without departing from the spirit or scope thereof.

EXAMPLES

A mixture consisting of 1.0 gm superconducting powder of $Y_1Ba_2Cu_3O_x$, 0.3 gm silver powder, 0.1 gm perfluoroisobutyl acrylate polymer and 0.5 gm methyl ethyl ketone was shaken in a vial with tungsten carbide ball on a mixer-shaker for 20 minutes to give a well dispersed paint. Both the superconducting oxide and the silver were used as very finely divided powders (1–5 micron) to facilitate particle dispersion. This mixture was applied onto sapphire substrates by either painting with a brush or spin coating at 3,000 rpm. The coated samples were air dried and heated to 250° C. for six hours to evaporate off residual solvents. Further heating at 400° C. for twelve hours removed the polymer binder. This was followed by annealing at 900° C. in the presence of oxygen for 12–24 hours to give durable, adherent and continuous coatings with superconducting transitions near 90° K. The spin coated films are 15–20 microns thick while the brushed on coatings are typically 17–30 microns thick.

The relative amounts of the components are important in achieving above 77° K. superconductivity as demonstrated by the following data:

| $Y_1Ba_2Cu_3O_x$ (gm) | Silver Powder (gm) | Properties ($T_c$) |
|---|---|---|
| 1 | 0.01 | - (Too Brittle) |
| 1 | 0.05 | - (Too Brittle) |
| 1 | 0.10 | 90° K. |
| 1 | 0.20 | 92° K. |
| 1 | 0.30 | 90° K. |
| 1 | 0.50 | - (Metallic) |

Following the above procedure using Sn in place of silver also provided coatings which were superconducting at liquid nitrogen temperature.

Substitution with other superconducting oxides such as $Ho_1Ba_2Cu_3O_x$ and $Dy_1Ba_2Cu_3O_x$ for $Y_1Ba_2Cu_3O_x$ provided superconducting coatings with $T_c$ both at 90° K. Other lanthanum elements such as Nd, Sm, Eu, Gd, Er, Tm and Lu would also work in place of Y in $Y_1Ba_2Cu_3O_x$.

The above silver mixture spin coated onto aluminum oxide and sapphire substrates gave superconducting coatings at 90° K.

The above silver mixture spin coated onto aluminum oxide and sapphire substrates gave superconducting coatings at 90° K.

When non-fluorinated phenolic and acrylic polymeric binders were used instead of the fluoroacrylate polymer, coatings with substantially lowered superconductive transition temperatures were obtained due to carbonizing of those polymers during the heating process. Where the fluorinated polymer is used, the heating removed it without substantial carbon residue, leaving a coating consisting essentially of the superconducting ceramic and the metal.

It should be noted that when the foregoing procedures were used to make coatings without the use of the metal particles, the resulting coatings were brittle and did not adhere to the substrate. In like manner, when no polymer was added to the coating composition, the resulting coatings were less uniform and inclined to form pin holes, particularly upon spin coating. The use of the polymer in the process is necessary for the resulting coating to be continuous.

What is claimed is:

1. A process for applying an adherent, durable and continuous coating electrically superconducting above 77° K. to a substrate, said process comprising: (1) suspending in an organic solvent ceramic particles superconducting above 77° K. of less than 10 microns in diameter and metal particles less than 10 microns in diameter with a fluorinated organic polymer soluble in said solvent, the metal being present in an amount from 10% to 40% by weight of the ceramic, (2) applying said suspension to the substrate, and (3) heating to remove the solvent and organic polymer.

2. A process as claimed in claim 1 wherein the removal of the solvent and the organic polymer is followed by annealing in the presence of oxygen.

3. A process as claimed in claim 1 wherein the solvent is removed by gradual heating to 100° C. and holding at that temperature for several hours, and then by heating at 400° C. for from 5 to 20 hours to remove the organic polymer.

4. A process as claimed in claim 1 wherein, after heating to remove the solvent and organic polymer, the coating is heated at 900° C. in oxygen for from 5 to 20 hours and then slowly cooled at the rate of about 100 C. degrees per hour to 300° C. in oxygen before removing it from the oven.

5. A process as claimed in claim 1 wherein the metal is silver, tin or gold.

6. A process as claimed in claim 1 wherein the organic polymer is a fluoroalkyl-acrylic acid ester.

7. A process as claimed in claim 1 wherein an organic dispersant (surfactant) is added to the formulation.

8. A process as claimed in claim 1 wherein the solvent is methyl ethyl ketone.

* * * * *